United States Patent
Lippmann et al.

(10) Patent No.: US 7,122,899 B2
(45) Date of Patent: Oct. 17, 2006

(54) SEMICONDUCTOR DEVICE AND PRODUCTION PROCESS

(75) Inventors: Bernhard Lippmann, Bruckberg (DE); Stefan Wallstab, München (DE); Günter Schmid, Hemhofen (DE); Rainer Leuschner, Nohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 34 days.

(21) Appl. No.: 10/133,336

(22) Filed: Apr. 26, 2002

(65) Prior Publication Data

US 2003/0127709 A1    Jul. 10, 2003

(30) Foreign Application Priority Data

Apr. 26, 2001    (DE)    ................ 101 20 520

(51) Int. Cl.
*H01L 23/45*    (2006.01)

(52) U.S. Cl. ............... 257/758; 438/622; 438/618

(58) Field of Classification Search ............... 257/40, 257/410, 613, 290, 291, 292, 758; 438/491, 438/488, 618, 622; 323/294, 368
See application file for complete search history.

(56) References Cited

U.S. PATENT DOCUMENTS

| 4,941,034 | A | | 7/1990 | Schrenk |
| 5,858,843 | A | * | 1/1999 | Doyle et al. ............. 438/299 |
| 5,861,652 | A | | 1/1999 | Cole et al. |
| 5,881,155 | A | | 3/1999 | Rigal |
| 5,883,000 | A | * | 3/1999 | Pasch .................. 438/618 |
| 6,316,124 | B1 | * | 11/2001 | Boos et al. ............ 428/642 |
| 6,384,437 | B1 | * | 5/2002 | Tee et al. .............. 257/239 |
| 6,429,450 | B1 | * | 8/2002 | Mutsaers et al. ........ 257/40 |
| 6,617,623 | B1 | * | 9/2003 | Rhodes ................. 257/215 |

FOREIGN PATENT DOCUMENTS

| DE | 196 01 390 A1 | 7/1997 |
| EP | 0 860 882 A2 | 8/1998 |
| FR | 2 580 834 | 10/1986 |

* cited by examiner

*Primary Examiner*—Douglas W. Owens
(74) *Attorney, Agent, or Firm*—Laurence A. Greenberg; Werner H. Stemer; Ralph E. Locher (57) ABSTRACT

An ohmic resistance is present between two parts of a conductor layer so that the size of the ohmic resistance can be ascertained and/or a semiconductor region is present in or on a layer forming the dielectric. The conductor layer is structured into a gate contact, a source contact, and a drain contact so that a transistor function or switching function is possible in the semiconductor region. Such a configuration allows an attempt to analyze the circuit integrated in the chip to be detected.

38 Claims, 4 Drawing Sheets

SEMICONDUCTOR DEVICE AND PRODUCTION PROCESS

BACKGROUND OF THE INVENTION

Field of the Invention

The present invention relates to a semiconductor device with improved protection against undesired analysis, improper intervention and unauthorized use or replication, and also to a production process for such a device.

Semiconductor devices are usually integrated in a semiconductor chip that has a substrate or a semiconductor body with a layered structure applied to it. Such a layered structure usually includes semiconductor layers epitaxially deposited on the substrate, with the active devices of an integrated circuit formed therein, and a multi-layered structure applied on top, having one or more metal layers structured to form interconnects and contacts that are separated and isolated from one another by intermetal dielectrics. Active devices and structures, such as, for example, the component parts of a transistor, are restricted to the region of the semiconductor material or of the semiconductor layered structure. The metallizations and interconnect levels serve for the electrical connection of the individual terminals of the devices, which altogether form the integrated circuit.

The semiconductor material of the integrated circuit, therefore, usually forms a unitary chip body, on the upper side of which the electrical terminals and the wiring are present. A planarizing passivation is usually used as a covering and an electrically isolating encapsulating compound is usually used as a housing. There are no active devices in the covering part of the semiconductor chip.

In what is referred to as reverse engineering, the construction of an integrated circuit is analyzed by finding out about the internal structure of the semiconductor chip by suitable methods of investigation. For such a purpose, covering layers, housings, and passivations generally have to be removed. If reverse engineering is to be prevented, because the integrated circuit is to remain secret, suitable ways that make analysis of the circuit impossible, or at least much more difficult, must be provided.

Examples of such preventions are, for example, coverings of the semiconductor chip that cannot be removed without significant destruction of the integrated circuit. Particularly advantageous are coverings with component parts integrated therein that cause active components of the circuit to bring about a certain kind of destruction or alteration of the circuit if manipulations to the component parts of the covering are discovered. The circuit components of such actively functioning protective shields constitute a component part of the circuit integrated in the semiconductor chip.

The problem of preventing undesired analysis of the circuit integrated in a semiconductor chip arises especially in the case of smartcard processors in chip cards and in the case of other security-critical ICs. If the circuit is made available, the chips can be replicated with these processors such that they enable the desired function without, at the same time, charging for the service provided in this way. For a chip card manufacturer, it is, therefore, important that such replication of the semiconductor chips used in the cards is made as difficult as possible. To effect the protection, the analysis of the chip construction or of the circuit, and possible manipulation of the switching behavior, must be prevented as far as possible. It is also important that the authenticity of the chip card or of the processor integrated in it can be detected at a terminal at which a chip card is used.

French Patent Document FR 2 580 834 describes a chip card in which an integrated circuit provided with a microprocessor checks the ohmic resistances present between interconnects on the upper side, especially a Wheatstone bridge formed thereby, to ascertain that they are intact. If a problem is discovered, the function of the circuit is disabled to the extent that it cannot be misused, in particular, cannot be exchanged with the circuit of another chip card.

SUMMARY OF THE INVENTION

It is accordingly an object of the invention to provide a semiconductor device and production process that overcome the hereinafore-mentioned disadvantages of the heretofore-known devices and methods of this general type and that provides an integrated circuit with protection against analysis or intervention that cannot be substituted or simulated after a manipulation.

With the foregoing and other objects in view, there is provided, in accordance with the invention, a semiconductor device including an electronic device selected from at least one of the group consisting of an active device and an integrated circuit, a layer structure applied to the electronic device, the layer structure having a layer of a dielectric, at least one conductor layer having at least one structured portion, at least one configuration selected from the group consisting of a multi-layered resistance network, a resistance network characteristic of a respective chip, a polymer film having varying concentrations of doping atoms therein to form a resistance network, and a material having a semiconductor region formed therein, the material having at least partly semiconducting properties, the material disposed at the dielectric layer, the semiconductor region performing a function of the electronic device based upon a configuration of the conductor layer, the configuration connected to enable a prescribed checking of at least one electrical property of the configuration. The layer structure can be a structure with a plurality of layers. The material can be disposed in or on the dielectric layer.

A semiconductor device according to the invention includes at least one active device, in particular, an integrated circuit, and a layer or layered structure applied to the semiconductor material. The layer or layered structure, in principle, corresponds to a conventional wiring level including a dielectric and a conductor layer structured in parts, in particular, a metal layer. Unlike conventional semiconductor chips, in the case of the semiconductor device according to the invention, there is at least one ohmic resistance of prescribed conductivity between two parts of the conductor layer, these parts of the conductor layer being connected to the active device or the integrated circuit such that the size of the ohmic resistance can be ascertained, and/or in or on the layer including the dielectric there is a semiconductor region of a material with at least partly semiconducting properties, the conductor layer having been applied with respect to the semiconductor region such that a function of an active device and/or a switching function can be performed in the semiconductor region by applying electric voltages to the parts of the semiconductor layer.

An embodiment with an ohmic resistance present between the parts of the conductor layer is preferably configured such that there is a resistance network between a number of parts of the conductor layer and these parts of the conductor layer are connected to an integrated circuit in the semiconductor chip such that characteristic properties of the resistance network can be ascertained. As such, there is a resistance network that is characteristic of the respective chip and can be checked with the integrated circuit and, based thereupon, the intactness of the chip can be monitored and/or its identity established. A resistance network should have, for such a purpose, resistances that are as nonlinear as possible to increase the complexity of the chip identification.

In accordance with another feature of the invention, the resistance network is a single-layer or multi-layer film of at least one material including hydrogen-doped amorphous silicon (a-Si:H), polysilicon, hydrogen-doped amorphous carbon (a-C:H), amorphous carbon (a-C:H:N), titanium nitride, tantalum nitride, an electrically conductive polymer, and/or an organic monomer.

In accordance with a further feature of the invention, the semiconductor region is a semiconducting layer, the at least one structured portion is a plurality of structured portions, and the structured portions of the conductor layer are electrically conductingly connected as contacts to the semiconducting layer.

In accordance with an added feature of the invention, the semiconducting layer with the contacts is formed as a resistance network and the contacts are connected to the integrated circuit to ascertain characteristic properties of the resistance network.

In accordance with an additional feature of the invention, the semiconductor region and the structured portions of the conductor layer form a field-effect transistor as a switch.

In accordance with yet another feature of the invention, the semiconducting layer with the contacts is a photodiode picking off photocurrent between the contacts when the semiconductor device is irradiated.

In accordance with yet a further feature of the invention, the contacts are disposed to induce a current flow in the semiconducting layer and the contacts pick off a Hall voltage occurring as a consequence of an external magnetic field.

In accordance with yet an added feature of the invention, the dielectric layer has a semiconductor region with a portion having a surface free from the dielectric, a gate dielectric is provided at a portion of the conductor layer as a gate electrode, and the gate dielectric is applied to the surface of the portion in at least one region.

In accordance with yet an additional feature of the invention, the semiconductor region has source and drain regions laterally disposed with respect to the gate dielectric in the semiconductor region and formed by introduction of dopant, the source regions are provided at a portion of the conductor layer as a source terminal, and the drain regions are provided at a portion of the conductor layer as a drain terminal.

In accordance with again another feature of the invention, portions of the conductor layer are disposed between the dielectric layer and the semiconductor region.

In accordance with again a further feature of the invention, the semiconductor region is of a material, a dielectric layer is a gate dielectric disposed between a portion of the conductor layer and the material of the semiconductor region, and a portion of the semiconductor region adjacent to the gate dielectric is a channel region of a transistor.

In accordance with again an added feature of the invention, the layer structure has a passivation layer with a first side facing away from the semiconductor region and a second side facing the semiconductor region, the semiconductor region is of an organic material and is disposed in the dielectric layer over the passivation layer, a gate electrode is disposed as a portion of the passivation layer at the first side of the passivation layer, and a source electrode and a drain electrode are disposed as portions of the conductor layer at the second side of the passivation layer.

In accordance with again an additional feature of the invention, the gate electrode is disposed as a portion of the passivation layer on the first side of the passivation layer and the source electrode and the drain electrode are disposed as portions of the conductor layer on the second side of the passivation layer.

In accordance with still another feature of the invention, the layer structure has a passivation layer with a side facing the semiconductor region, the semiconductor region is of an organic material and is disposed in the dielectric layer at the passivation layer, a gate electrode, a source electrode, and a drain electrode are disposed as portions of the conductor layer on the side of the passivation layer facing the semiconductor region, and a portion of the dielectric layer is a gate dielectric disposed between the gate electrode and the semiconductor region.

In accordance with still a further feature of the invention, the semiconductor region is disposed in the dielectric layer over the passivation layer;

In the case of another embodiment of the semiconductor device, a structure of an active device or of an electronic circuit has been applied to an upper side of the chip in or on a layer of a dielectric, in particular, an intermetal dielectric between the metallic wiring levels, whereby a function of an active device and/or a switching function can be performed by applying electric voltages. For such a purpose, the semiconductor device is provided with a semiconductor region that is disposed in or on the layer including a dielectric so that it is completely separated from the semiconductor material of a layered structure applied to a substrate or of a semiconductor body.

The semiconductor region is formed from a material that has at least partly semiconducting properties. It may be a semiconductor material that is doped to make it electrically conduct completely, or at least in certain regions, or else a plastics material, such as, for example, a polymer that is provided with semiconducting properties, at least in certain regions. There is a suitably structured conductor layer, for example, a metal layer, which has been applied with respect to the semiconductor region, for example, in particular, disposed in its vicinity such that a switching function can be performed in the semiconductor region by applying electric voltages to the parts of the conductor layer. The structure formed by the semiconductor region and the parts of the conductor layer is preferably a structure of a field-effect transistor suitable as a switch.

In the case of preferred embodiments, the semiconductor region is formed as a well in the dielectric layer and the conductor layer has been applied to an upper side of the semiconductor region. In the case of other preferred refinements, the semiconductor region is disposed on a side of the structured conductor layer facing away from the dielectric layer, the parts of the conductor layer preferably being surrounded on several sides by the material of the semiconductor region.

A resistance network disposed on the semiconductor chip or an applied electronic circuit may be used as a protective device against unauthorized analysis of the integrated circuit, which is referred to hereafter as a sealing coating. Such a sealing coating is preferably applied to a last metal layer, provided as a wiring level, or an insulator covering of the semiconductor chip. The sealing coating is connected to the electronic circuit integrated in the semiconductor chip by vertical conducting connections (contact hole fillings, vias).

As soon as the supply voltage has been applied to the semiconductor chip, the circuit integrated therein can check the presence of the sealing coating by some kind of measurement. If it is established that the sealing coating is absent or a response to a measuring signal sent to the sealing coating differs significantly from an expected echo signal, unauthorized intervention affecting the intactness of the chip is assumed. The integrated circuit may then, for example, cause the semiconductor chip to be made unusable, make it impossible for important functions of the chip to be performed any longer, and/or erase the content of a memory integrated in the chip.

Because the sealing coating lies over the wiring (for example, of aluminum), to interfere with the chip, it is first necessary to remove the sealing coating. The sealing coating is, therefore, constructed such that the resistance network integrated therein and the integrated circuit cannot be analyzed by simple measurement and cannot be bridged by equivalent resistances or an equivalent circuit.

The sealing coating, therefore, preferably includes at least two layers, which are very thin (preferably thinner than 1 μm), respectively perform different electrical functions, and cannot be separated from one another or be selectively etched. The layers should, as far as possible, are of like materials, so that, when it is attempted to etch away the sequence of layers by chemical or mechanical processes, it cannot be easily perceived when precisely a layer has respectively been removed. If the uppermost layer is electrically isolating, a resistance network covered therewith cannot simply be measured by needle contacting.

Such a resistance network between the parts of the metal layers, applied to the chip or integrated in a deeper layer of the wiring levels and intermetal dielectrics, can also be used for the purpose of checking by suitable measurement, by a reader in a terminal (permanently installed user device), whether an authentic chip or authentic processor is being used. The characteristic measuring signals obtained from the resistance network are compared with the encrypted data transmitted from a memory of the chip, which makes possible a chip identification that is comparable with the identification of banknotes based upon the serial numbers. The authentic resistance network on a semiconductor chip in this respect conforms to certain physical laws, and consequently has certain characteristics that are accepted by the terminal as authentic.

To be able to replicate a chip provided with such an embodiment of a semiconductor device according to the invention, it is necessary to imitate the resistance network with its properties. What is more, the encryption code by which the resistance network is checked for its authenticity must be known because, otherwise, the chip identification is not accepted by the reader. In the event that someone, nevertheless, succeeds in breaking the encryption code and replicating semiconductor chips with a resistance network of their own, a further security stage can be provided by using resistance networks that differ from chip to chip. The replicated chips must then be provided with resistance networks that have certain prescribed deviations from one another. The readers of an operating organization (for example, a bank) can establish by a statistical evaluation of the chip identifications whether or not the deviations of the resistance networks from chip to chip correspond to the prescribed specifications, or possibly abnormally frequent occurrences of certain types of resistance networks occur. If the individual chips are not identical to one another, the effect is also achieved that a full analysis of the chip construction can only be obtained with great difficulty from the results of investigations of a number of chips. Consequently, increased security is achieved, in particular, in the use of chip cards. If a significant deviation from the prescribed specifications is established, the chip card type concerned can be blocked and, thus, excluded from use.

With the objects of the invention in view, there is also provided a process for producing a semiconductor structure, including the steps of producing a structure selected from the group consisting of an active device and an integrated circuit in a body selected from a substrate, a semiconductor body, or a semiconductor layered structure, electrically isolating the structure from at least one conductor layer with a dielectric material, the conductor layer having structured portions and being provided to present ohmic resistances, and depositing a film and structuring the film to form a resistance network presenting the ohmic resistances between two respective structured portions of the conductor layer, the ohmic resistances having prescribed conductivities.

The process according to the invention provides for a single-layer or multi-layer film to be deposited and structured to form a resistance network so that ohmic resistances of prescribed conductivities are present between two parts respectively of a conductor layer provided for such a purpose. If a device suitable for a measurement or switching function or an electronic circuit is provided in the region of the dielectric layers between the wiring levels, in addition to the production of the structured conductor layers provided for the wiring, with dielectric layers disposed in between, a semiconductor region of an at least partly electrically conducting material is formed in or on a layer including a dielectric and is contacted with one or more parts of one or more conductor layers such that the resulting structure can be used as an active device, in particular, as a switching transistor.

As such, active devices or circuit components can be formed in the region of the wiring levels, in particular, an uppermost metal layer of a semiconductor chip. In this way it is also possible to create highly effective sensors for external irradiation, the influence of electromagnetic fields and physical interventions affecting the intactness of the semiconductor chip. Such a sensor is formed in a layer that allows a direct reaction to an external influence, for example, by an electric signal being immediately generated. Accordingly, active protective shields for security-critical circuits can be created, in particular. These active protective shields may also be used in conjunction with the resistance network described above.

In accordance with still an added mode of the invention, the deposition step is carried out by depositing a single-layer or multi-layer film.

In accordance with still an additional mode of the invention, there is provided a structured film disposed between a number of portions of the conductor layer as a resistance network.

In accordance with a further mode of the invention, the film is produced by one of depositing, by one of chemical vapor deposition and plasma enhanced chemical vapor deposition, one of hydrogen-doped amorphous silicon (a-Si:H), polysilicon, hydrogen-doped amorphous carbon (a-C:H), amorphous carbon (a-C:H:N), titanium nitride, and tantalum nitride, depositing one of the group consisting of hydrogen-doped amorphous carbon (a-C:H) and amorphous carbon (a-C:H:N) by sputtering, depositing and doping a polymer, and vapor depositing an organic monomer.

In accordance with an added mode of the invention, the film is produced with at least one material including electropolymerized and doped polythiophene, doped polyaniline applied by spin-coating, and vapor-deposited pentazene.

In accordance with an additional mode of the invention, the film is produced by chemical vapor deposition of one of hydrogen-doped amorphous silicon (a-Si:H), polysilicon, hydrogen-doped amorphous carbon (a-C:H), amorphous carbon (a-C:H:N), titanium nitride, and tantalum nitride.

In accordance with yet another mode of the invention, the film is produced by plasma enhanced chemical vapor deposition of one of hydrogen-doped amorphous silicon (a-Si:H), polysilicon, hydrogen-doped amorphous carbon (a-C:H), amorphous carbon (a-C:H:N), titanium nitride, and tantalum nitride.

In accordance with yet a further mode of the invention, the film is produced by sputtering one of hydrogen-doped amorphous carbon (a-C:H) and amorphous carbon (a-C:H:N).

In accordance with yet an added mode of the invention, the film is produced by depositing and doping a polymer.

In accordance with yet an additional mode of the invention, the film is produced by vapor depositing an organic monomer.

With the objects of the invention in view, there is also provided a process for producing a semiconductor structure, including the steps of producing a structure selected from the group consisting of an active device and an integrated circuit in a body selected from the group consisting of a substrate, a semiconductor body, and a semiconductor layered structure, applying to the structure a layer configuration having at least one layer of a dielectric, producing, at the dielectric layer, a semiconductor region from a material having at least partly semiconducting properties, and applying at least one conductor layer with respect to the semiconductor region and structuring portions of the conductor layer such that at least one of an active device function and a switching function can be performed in the semiconductor region.

In accordance with again another mode of the invention, the semiconductor region is produced in or on the dielectric layer.

In accordance with again a further mode of the invention, the semiconductor region and the conductor layer are formed by, in a first step, producing a clearance in the dielectric layer and filling the clearance with the material of the semiconductor region, in a second step, producing a dielectric layer as a gate dielectric on a region on an upper side of the material of the semiconductor region, and, in a third step, depositing and structuring the conductor layer to form at least one part on the gate dielectric and to form other parts on mutually opposite sides of the one part and laterally of the one part on the material provided of the semiconductor region.

In accordance with again an added mode of the invention, between the second step and the third step, a dopant is introduced into the semiconductor region, in a self-adjusted manner with respect to the gate dielectric, to form source and drain regions.

In accordance with again an additional mode of the invention, the semiconductor region and the conductor layer are produced by, in a first step, depositing and structuring a conductor layer to form parts at least including a gate electrode, a source terminal, and a drain terminal, in a second step, depositing and structuring a dielectric layer to form a gate dielectric on the gate electrode part of the conductor layer while a surface of the source and drain terminal parts of the conductor layer respectively remains free from the dielectric layer, and, in a third step, applying the material of the semiconductor region to provide a first part of the material over the gate dielectric as a channel region and to connect other parts of the material contiguous with the first part of the semiconductor region to the surfaces of the source and drain terminal remaining free from the dielectric layer.

In accordance with a concomitant mode of the invention, the first step is carried out by also depositing a polysilicon layer doped to be electrically conductive onto the conductor layer and structuring the polysilicon layer together with the conductor layer.

Other features that are considered as characteristic for the invention are set forth in the appended claims.

Although the invention is illustrated and described herein as embodied in a semiconductor device and production process, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
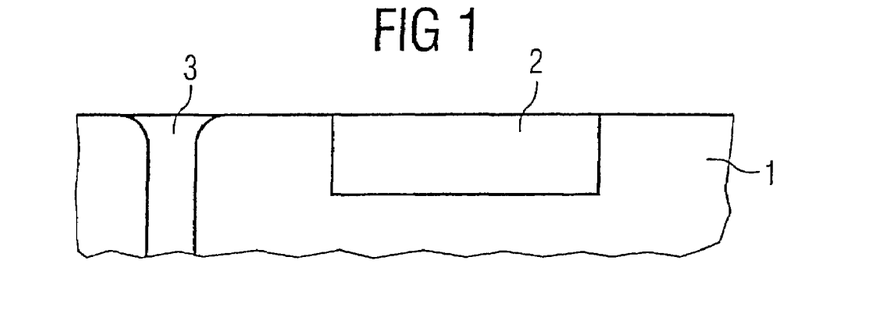
FIG. 1 is a fragmentary, cross-sectional view of a step in a production process for a first exemplary embodiment of the semiconductor device according to the invention.
Figure 2:
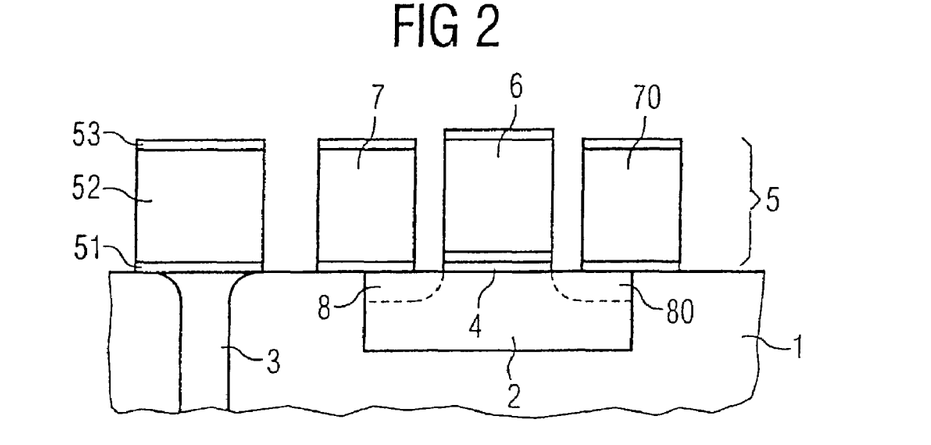
FIG. 2 is a fragmentary, cross-sectional view of a further step in the production process of FIG. 1.

Referring now to the figures of the drawings in detail and first, particularly to FIGS. 1 and 2 thereof, there is shown cross-sections illustrating a detail of a device after various process steps of a preferred embodiment of the invention. In FIG. 1, a detail from a layer including a dielectric 1, which represents a layer of the wiring level of a semiconductor chip, is represented in cross-section. The dielectric 1 is, for example, an intermetal oxide, as is referred to per se from the production of multi-layer wiring structures. Disposed between these intermetal dielectrics are the structured metal layers, in which the interconnects provided for the electrical connection of the terminals of the active devices of the electronic circuit are formed. To allow the various wiring levels to be connected to one another, perpendicular holes, referred to as via holes, are produced during production in the intermetal dielectrics for plated-through paths to be established by vertical electrically conducting connections. Depicted in FIG. 1 is such a contact hole 3, as referred to per se from conventional production processes for semiconductor chips, to explain the special features of the process according to the invention.

In the case of such an exemplary embodiment, a clearance for the semiconductor region 2 to be produced is also formed in the dielectric 1, which can take place, in particular, by etching out the dielectric. A material that has semiconducting properties, at least in certain regions, or can at least be provided with semiconducting properties, is introduced into the clearance. In the case of preferred refinements, the material may be crystalline silicon or polycrystalline silicon, which is doped to make it electrically conduct or is at least made electrically conducting with dopant in certain regions in later process steps.

The contact hole 3 can be filled in a conventional way with a customary contact hole filling, for example, tungsten. In the case of the device according to the invention, it is, instead, possible to fill both the clearance provided for the semiconductor region 2 and the vertical contact holes with electrically conducting semiconductor material, in particular, with silicon. As required, the surface of the dielectric 1 can subsequently be planarized, which can take place for example by Chemical Mechanical Polishing (CMP).

According to the invention, the region so produced, with an at least partly semiconducting material, referred to hereafter as the semiconductor region, is used for the forming of active devices or components. The function of the active device in the semiconductor region is preferably a switching function, which is brought about by a transistor structure.

To form a transistor structure, in the described example according to FIG. 2, first a gate dielectric 4 is applied to a region of the free surface of the semiconductor region. Following that, a conductor layer 5 is deposited and structured in parts. The materials of the conductor layer 5 may coincide with the materials otherwise used for interconnects and contacts. The conductor layer 5 may be a single layer, for example, of metal, or a multiple layer, in which for example a barrier layer 51, a comparatively much thicker metal layer 52, and a thin covering layer 53 (top layer) are disposed one on top of the other. The barrier layer 51, which is intended to prevent possible out-diffusion of the metal into the semiconductor material, may be, for example, titanium nitride. The metal layer 52 is, for example, aluminum or tungsten. The covering layer 53, which, inter alia, prevents corrosion, may be, for example, WSi, TiSi, Ti, or TiN. However, the precise form that the conductor layer 5 takes is not important for the invention.

The conductor layer 5 is then structured such that parts that, in this example are provided as the gate electrode 6 and as the source terminal 7 and drain terminal 70 are formed. The gate electrode 6 is disposed on the gate dielectric 4. The source terminal 7 and the drain terminal 70 form contacts directly on the material of the semiconductor region 2. To form the source region 8 and the drain region 80 in the semiconductor region 2, dopant may also be introduced into these regions, in a self-adjusted manner with respect to the gate dielectric, before the application of the conductor layer 5. For such a purpose, the same mask that is also used for the structuring of the gate dielectric 4 is preferably used. If the operating properties (performance) of the transistor are adequate for the intended switching function, it is, however, possible at this point to dispense with the additional introduction of dopant.

The structure represented in FIG. 2 may be used when applying electric voltages to the parts of the conductor layer 5 for initiating switching functions. Independently of the remaining structure of the device, which, in principle, may take any desired form, it is possible to create in the semiconductor region 2 of the transistor structure of FIG. 2, for example, a sensor with which every physical change on the upper side of the device can be established. If in the example of FIG. 2 a passivation of the device applied to the upper side is removed and the conduction of the gate electrode 6, the source terminal 7, or the drain terminal 70 is interrupted, the change brings about a perceptibly defective switching function of the transistor.

Consequently, a security-critical signal, which is present at the gate electrode 6 as an electric voltage, can also be used, in particular, for the forming of an active protective shield (active shield guard). A change of the security-critical signal brings about a change in the current flow between the source and drain in the channel, which can be measured to establish the change in the signal at the gate. Such a device is, therefore, suitable for monitoring security-critical signals in the uppermost layers of a semiconductor chip.

Figure 3:
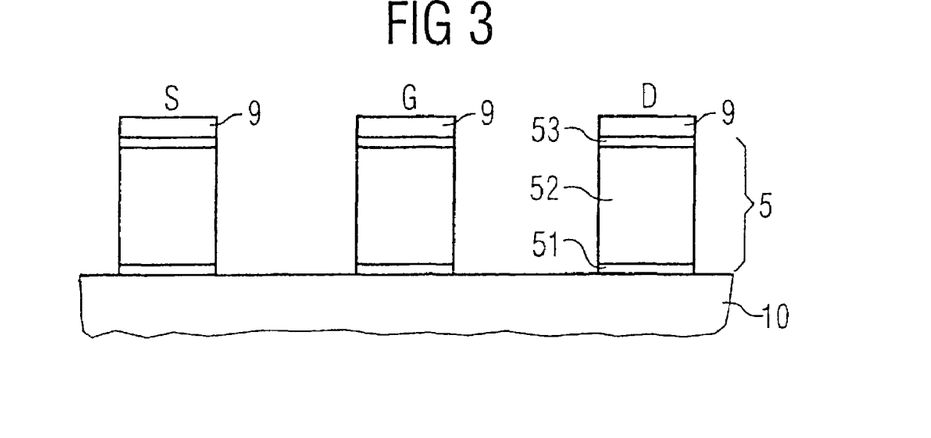
FIG. 3 is a fragmentary, cross-sectional view of a step in a production process for a second exemplary embodiment of the semiconductor device according to the invention.

In the case of an alternative exemplary embodiment, the semiconductor region is disposed on the side of the conductor layer facing away from the dielectric layer. Represented in FIG. 3, in turn, is a layer including a dielectric 10 on an upper side of a semiconductor chip. The layer may be, in particular, an intermetal dielectric of the wiring levels. In the case of this exemplary embodiment, the conductor layer 5 has been applied to the dielectric 10 and structured into various parts. On the conductor layer 5, which in this example, too, may include a barrier layer 51, a metal layer 52, and a covering layer 53, there is preferably a polysilicon layer 9 provided for the actual electrodes or contacts. This polysilicon layer 9 is doped to make it electrically conduct, for example, for n-type conduction. The conductor layer 5 and the polysilicon layer 9 are structured here jointly into parts that are respectively provided for the source S, gate G, and drain D.

Figure 4:
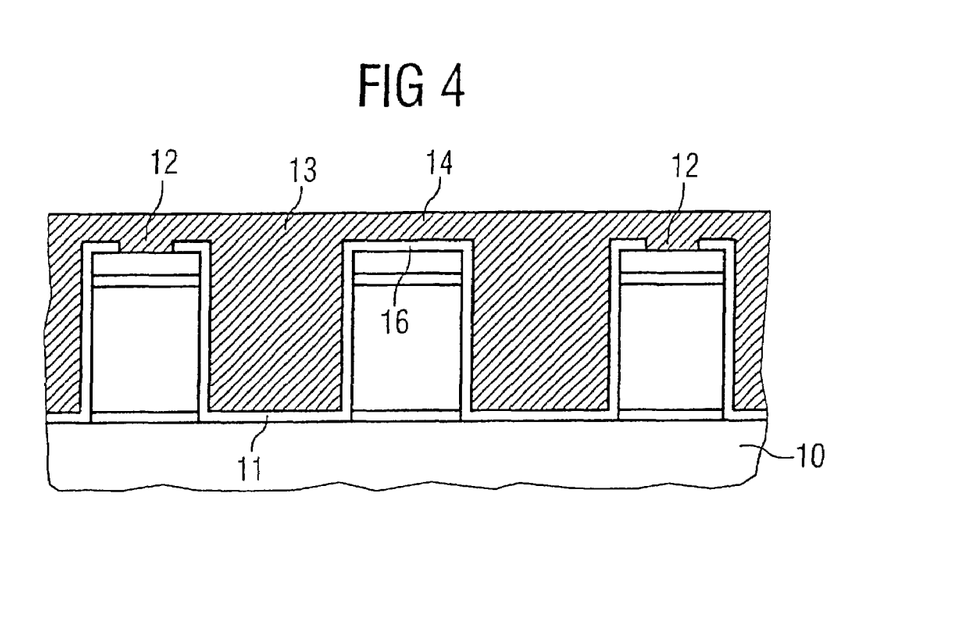
FIG. 4 is a fragmentary, cross-sectional view of a further step in the production process of FIG. 3.

As represented in cross-section in FIG. 4, a dielectric layer 11 is applied to the upper side, preferably initially over its full surface area. The dielectric layer 11, therefore, covers the free upper sides of the conductor layer 5, of the polysilicon layer 9, and of the dielectric 10. The dielectric layer 11 is structured such that part of the dielectric layer 11 remains as the gate dielectric 16 on the part of the conductor layer, and possibly of the polysilicon layer, provided for the gate.

On the parts of the conductor layer 5, or of the polysilicon layer 9, provided for the source and drain, at least as great a part of the dielectric layer 11 as required for a source contact or drain contact to be subsequently produced is removed. In the example represented, windows 12 are produced in the dielectric layer 11 on the upper side of the parts of the polysilicon layer 9 provided for the source and drain, which can be done, for example, by etching using a suitable mask. The material 13, which is provided for the semiconductor region, is then applied over the full surface area such that the conductor layer 5 and the polysilicon layer 9 are covered. What is important here is that part of the semiconductor region is formed as the channel region 14 over the gate dielectric 16.

Figure 5:
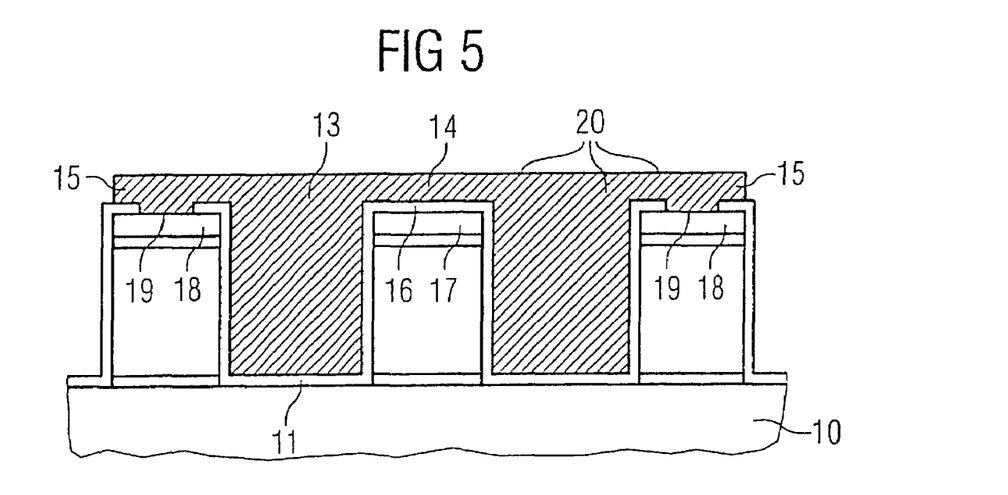
FIG. 5 is a fragmentary, cross-sectional view of a further step in the production process of FIG. 3.

FIG. 5 shows that the applied material 13 of the semiconductor region 20 has been removed at the flanks 15 to such an extent that the semiconductor region 20 is restricted to the region provided for the active device. There is now a transistor structure in which a gate electrode 17, formed from part of the polysilicon layer, is separated by the gate dielectric 16 from the channel region 14 present in the semiconductor region 20. The channel region 14 is connected to parts of the semiconductor region that form contacts 19 with the parts of the polysilicon layer provided as the source contact and drain contact 18. The lateral restriction of the semiconductor region 20 makes it possible to dispose a number of active devices that are electrically isolated from one another over the dielectric layer 10 in the specified way. The device represented in FIG. 5 is again suitable for using a signal carried in the uppermost metal layer of the semiconductor chip for switching the transistor, and consequently for performing a sensor function or security function.

The resistance network present in the case of other exemplary embodiments of the semiconductor device may be formed from plasma enhanced chemical vapor deposition (PECVD) films, reactive sputter films (reactive sputtering), or polymer films. The conductivity of the films may be changed over several orders of magnitude by changing the depositing parameters (power, pressure, self-bias, gas composition, doping factor). Because the depositing systems are generally computer-controlled, the parameters can be continually changed from wafer to wafer in a way corresponding to a production list. Such a change achieves the effect that the chips differ from wafer to wafer. If the layout of the resistance network is varied from chip to chip by a lithography mask covering the wafer, every chip will differ from the other. The position of the terminal contacts with the resistance film or the geometry of the resistance film is in this way varied from chip to chip and, if appropriate, permutated within a prescribed selection.

If the resistance network is applied to the semiconductor chip as a sealing coating, and covered with an insulator layer, it is of advantage if the material of the conductor layer or of the conductive layers of the resistance network differs only slightly, in particular, in the chemical composition, from the material of the insulator layer. Such a slight difference makes an analysis of the functioning of the sealing coating more difficult. In the case of polymer films, the degree of doping (concentration of the doping atoms) is important, in particular. The aim of varying the conductivity of the individual part-layers over several orders of magnitude can be achieved, as mentioned, by the depositing parameters so that it is possible to dispense with a more substantial differentiation of the materials.

Suitable as the material for the resistance network are, in particular, hydrogen-doped amorphous silicon (a-Si:H), polysilicon, hydrogen-doped amorphous carbon (a-C:H), titanium nitride, tantalum nitride, conductive polymers (for example, electropolymerized doped polythiophene or doped polyaniline applied by spin-coating) and vapor-deposited organic monomer films (for example, pentazene) as well as sequences of layers of these materials. Preferred as suitable materials are those with a conductivity that depends on the electromagnetic field present, in particular, hydrogen-doped amorphous silicon (a-Si:H), polysilicon, hydrogen-doped amorphous carbon (a-C:H), and sequences of layers of these materials. Silicon, carbon and nitrides are, for example, deposited as PECVD films; amorphous carbon can, instead, be applied by sputtering.

In the case of a preferred exemplary embodiment with a film of a-C:H(:N), the chip is provided with contacts that are connected in an electrically conducting manner to the sealing coating. The contacts serve for measuring the resistance of the sealing coating. They are distributed at irregular intervals over the chip surface. In the interior of the chip, several or even all the contacts may be connected in parallel.

A resistance film is deposited by a plasma enhanced chemical vapor deposition (PECVD) process. The conditions preferred in such a case are: capacitive, parallel plate configuration, anode-cathode surface area ratio of 4:1, 300 W HF power (with an authorized frequency of 13.56 MHz), 0.2 mbar, 30° C. initial cathode temperature, plasma including ethene and nitrogen in a ratio of 1:0.75. At the beginning of the coating (first layer), the nitrogen fraction is still 0.05; after approximately 15% of the coating time, the nitrogen supply is switched fully on (second layer). The double layer so obtained has a thickness of approximately 120 nm and, with a low field strength of less than 0.1 V/µm, a resistivity in the lateral direction of $10^3$ Ωcm and in the vertical direction of $10^5$ Ωcm.

A third layer is applied thereover in a thickness of typically approximately 200 nm, without the vacuum being broken. The third layer differs from the first two layers only in that a higher pressure of 0.4 mbar is set during application and there is no nitrogen in the precursor gas. The third layer has a resistivity of typically $6 \cdot 10^8$ Ωcm and serves as an insulator.

As such, the chip is provided with a sealing coating of which only the insulating a-C:H layer appears on the outside, which does not allow direct electrical measurement. The layer is so hard that a test needle cannot easily pierce the layer. The three layers of the sealing coating cannot be pulled from one another, that is, separated. Because the a-C:H layers are deposited directly one after the other, they adhere very well on one another and cannot be selectively separated from one another by wet etching processes.

On the contact areas (pads) of the semiconductor chip, the sequence of layers that is otherwise protected by a resist mask of photoresist is removed by reactive ion etching with oxygen to make electrical connection (bonding) of the chip possible.

To compensate for temperature effects that affect the resistances, a pair of contact points, which serves as a thermocouple, is preferably provided on the chip so that the circuit of the chip can compensate for temperature-related resistance drift.

Depending on the size of the metal contacts provided, which are, for example, aluminum with an adhesion layer of titanium or a titanium compound, and the distance from the resistance film, current-voltage characteristics that exhibit variously pronounced non-linearities and different current intensities are produced when electric voltages are applied between contact points on the chip (with an electric field strength of at least 0.1 V/µm). The circuit integrated in the chip measures the current for at least two different electric voltages at the same contacts to register the non-linearity of the resistance in between. Corresponding components of the circuit are to be provided to make these voltages available. The resistance data are preferably stored in the chip. The form of the current-voltage characteristic cannot be recorded by measuring techniques from the outside, even when the uppermost insulating layer has been removed, because only the lateral resistance of the low-impedance double layer of a-C:H:N could be measured by contacting.

In the case of this exemplary embodiment, the sequence of layers of the sealing coating is not structured, disregarding the openings for the contacting of the contact areas of the integrated electronic circuit. The sealing coating, therefore, covers substantially the entire upper side of the chip. If the sealing coating is at least partially removed, the removal can be noticed by a change in resistance, which the chip can detect as soon as it is put under voltage. If appropriate, the circuit integrated in the chip can then destroy connections or overwrite memory contents if damage to the sealing coating is established.

Unlike the exemplary embodiment described above, in the case of a further exemplary embodiment with a film including a polymer, a layer of a polymer (for example, polyaniline) that is preferably deposited by spin-coating is used as the sealing coating. By suitable doping of the layer (dopant fraction less than 0.1% of the polymer fraction), the resistance of the organic semiconductor layer can be varied. Polyaniline can be doped with camphorsulfonic acid, which is added to the polymer before the spin-coating. A photo base is preferably also added, for example N-methyl-2,6-dimethyl-3,5-(diethyldicarboxylate)-4-(o-nitrophenyl)-1,4-dihydropyridine. Exposing the entire surface area to light of low wavelength in the ultraviolet range achieves the effect that the photo base neutralizes the camphorsulfonic acid in an upper part of the polymer layer that is approximately 300 nm thick. As a result, the upper layer becomes electrically insulating, and only the lower part of the layer, which is approximately 100 nm thick, remains conductive.

If the sealing coating is removed in a surface area between two terminal contacts, the resistance between the terminal contacts changes by a value that can at least approximately be determined computationally. This is even the case if the sealing coating is treated with acids because the conductivity of the sealing coating is then changed. The circuit of the chip can then detect the change in the resistance as soon as the circuit is subjected to the supply voltage. The countermeasures already described can then be introduced.

Generally a polymer layer (also referred to here as a buffer layer) is applied to the upper side of a semiconductor chip, which is provided with a passivation layer of oxide and/or nitride. The dielectric polymer layer may be made photosensitive to better expose the terminal contact areas. In particular, materials suitable for such a purpose are polymer formations based on polybenzoxazoles or polyimides. Polymers can be made semiconducting by incorporating an extensive π conjugation. A semiconducting polymer layer cannot be distinguished spectroscopically from a dielectric polymer layer. To be able to make a polymer layer adequately semiconducting, it is sufficient to form this layer in a thickness of 50 nm to 100 nm. The buffer layer can, therefore, be supplemented by a semiconducting polymer layer such that the presence of a semiconducting part of the buffer layer can be detected only with great difficulty. Structures that correspond to a field-effect transistor, and can, therefore, be used as a switch, can be formed in the semiconducting polymer layer, as already described in more detail above.

Figure 6:
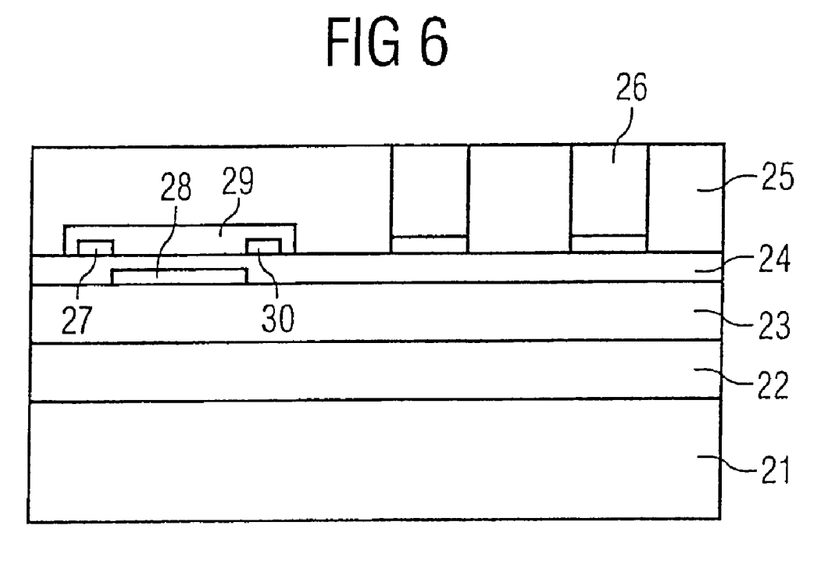
FIG. 6 is a cross-sectional view of an alternative embodiment of the semiconductor device according to the invention.

A further exemplary embodiment of the semiconductor device is represented in cross-section in FIG. 6. A substrate 21 or semiconductor body with the actual integrated circuits is provided with a wiring level 22, the structure of which depends on the integrated circuit is conventional and is, therefore, not represented in FIG. 6. The wiring level 22 usually includes one or more metallization levels, which are structured to form the interconnects of the electrical connections and connected to one another through intermetal dielectrics. As an example of a passivation applied to the surface of the device, a first passivation layer 23, which may be, for example, an oxide, in particular, silicon oxide, and a second passivation layer 24, which may be a nitride, in particular, silicon nitride, are represented in FIG. 6. Located thereon is a conventional buffer layer 25 of an organic material, in particular, a polymer. In it are openings for an external connection of the metal contacts 26. These metal contacts 26 are connected in an electrically conducting manner to the wiring level 22 through non-illustrated, conventional, vertical conducting connections.

In the organic buffer layer 25, at least one layer is made semiconducting, at least in certain regions. Disposed therein may be a device that has a function of an active device of a circuit. For example, there may be a simple field-effect transistor, which can be used as a switch to establish on the basis of the response of the transistor whether or not the buffer layer 25 is intact. In FIG. 6, such a field-effect transistor is depicted in diagrammatic form. Disposed here on the second passivation layer 24 are a source electrode 27 and a drain electrode 30. These electrodes may be a metal that is also applied for the contacts 26. During production, a metallization, which is structured to form the contacts 26 and the electrodes 27, 30, is in this case deposited onto the second passivation.

The electrodes 27, 30 provided for the transistor have been embedded into an organic semiconductor material 29. Here, the organic semiconductor material 29 is part of the buffer layer 25, which is made electrically conducting in certain regions. The organic semiconductor material 29 covers the source electrode 27 and the drain electrode 30 such that there is a source region and a drain region, and a channel region disposed in between. For the purpose of activating the channel region, there is a gate electrode 28 disposed on the first passivation layer 23 and within the second passivation layer 24.

In a way similar to the exemplary embodiment described above on the basis of FIG. 5, a transistor structure in which the channel region is disposed on the side of the gate electrode facing away from the substrate or semiconductor body is also formed in the case of the embodiment of FIG. 6. It is particularly expedient in the case of the exemplary embodiment according to FIG. 6 that the upper passivation layer, produced in any case in the case of the customary semiconductor chips, here the second passivation layer 24, is used at the same time as the gate dielectric between the channel region and the gate electrode.

Figure 7:
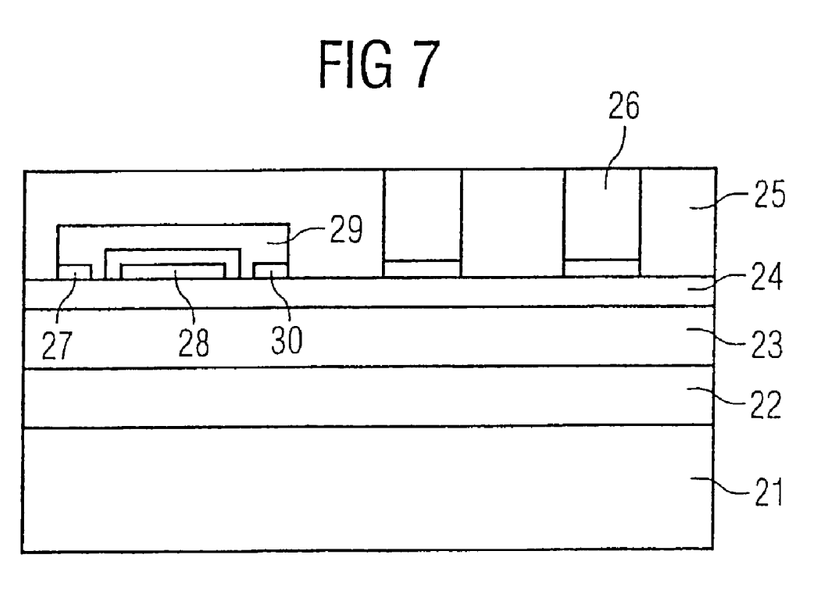
FIG. 7 is a cross-sectional view of another alternative embodiment of the semiconductor device according to the invention.

Represented in FIG. 7 is a further exemplary embodiment, similar to the exemplary embodiment of FIG. 6, in which the gate electrode 28, like the source electrode 27 and the drain electrode 30, is disposed on the second passivation layer 24. A dielectric part of the buffer layer 25, which typically has a thickness of approximately 100 nm to 300 nm, is used as the gate dielectric. A sequence of such layers can be easily produced in the buffer layer 25 according to FIG. 7. For such a purpose, firstly the dielectric part is applied over the gate electrode 28 and structured. Subsequently, the semiconducting part is applied and, as an organic semiconductor material 29, forms the source region, the drain region and the channel region of the transistor. After that, the buffer layer 25 can be completed, by once again applying a dielectric part of the material in a planarizing manner up to the intended total thickness of the buffer layer 25.

In the case of the semiconductor chip according to the invention, a resistance network can be integrated in a sequence of layers, in principle, any desired sequence of layers, above the semiconductor material, to provide a chip identification process in this way. To accomplish this, the chip is provided with contact points, which are led by electrically conducting connections to terminal contact areas of a chip carrier, for example, a chip card. These terminal contact areas serve for the data transmission between the chip and a terminal, for example, a reader. As well as the two terminal contact areas present in any case, which are provided for the data transmission and/or power transmission, in the case of the exemplary embodiment, there are at least two additional terminal contacts. In cases in which the values of the ohmic resistances of the resistance network are high enough, the terminal contact areas provided in any case may also be used for the determination of these resistances because, in these cases, no short circuit occurs between the terminal contact areas. In the wiring of the circuit integrated in the chip, four or more contact points are connected to one another by interconnects (for example, metallic interconnects) and paths of the film or the layer of the resistance network. In the case of four contacts provided for a connection to the reader, that amounts to 3!=6 connections.

In the exemplary embodiment of the semiconductor device with a resistance network for chip identification, the resistance network can be produced by a PECVD process, a suitable plasma containing ethene and nitrogen with a variable nitrogen fraction. The conditions are: capacitive, parallel plate configuration, an anode-cathode surface area ratio of 4:1, 300 W HF power (with an authorized frequency of 13.56 MHz), a pressure of 0.2 mbar, 30° C. initial cathode temperature. Depending on the nitrogen fraction (0 to 70%), layers with a thickness of approximately 100 nm and a resistivity of $10^8$ to $10^2$ Ωcm are obtained with an electrical field strength of less than 0.1 V/μm, if amorphous carbon (a-C:H:N) is deposited as the material.

The resistance layer is structured by a photo-lithographic technique, so that, on one hand, the terminal contact areas are exposed and, on the other hand, differently structured interconnects for each chip on the wafer are produced in the resistance layer between the contact points. Depending on the size of the metal contacts (for example, aluminum with titanium adhesion layer) and their distance from the resistance film and also the length, width, and thickness of the paths from the resistance film and the specific field-dependent conductivity of the material of the resistance film (in the case of field intensities above 0.1 V/μm), current-voltage characteristics with variously pronounced non-linearity and different current intensities are produced for electric voltages between contacts on the chip as a function of the voltage.

Here, too, a thermocouple may be provided on the chip to compensate for temperature effects on the resistance. A temperature-related resistance drift is preferably eliminated computationally in the reader before the measurement data of the individual resistance paths are compared with the stored characteristic data of the chip. This consequently achieves the effect that the individual semiconductor chips have individual characteristic data, which can be checked by a terminal in a simple way.

In the case of an alternative exemplary embodiment of such a form of the semiconductor chip according to the invention, for simple chip identification, the film of the resistance network is produced from amorphous carbon without incorporated nitrogen (a-C:H). Here, a plasma of methane with variable HF power is used. Depending on the power (200 to 500 W), layers with a thickness of typically approximately 100 nm and a resistivity of $10^4$ to $10^1$ Ωcm are obtained with a low electrical field strength below 0.1 V/μm.

Figure 8:
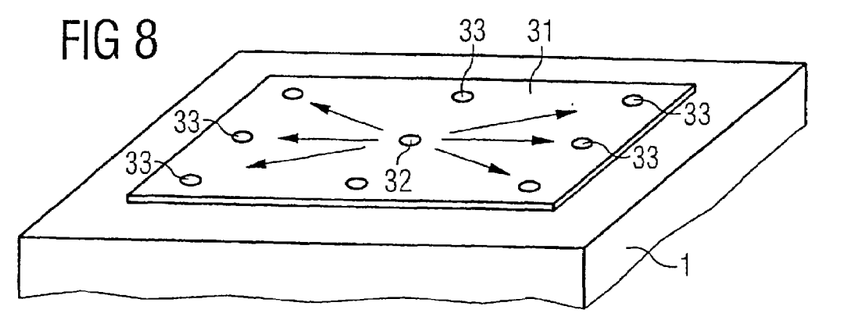
FIG. 8 is a diagrammatic, fragmentary, perspective view of a further embodiment of the semiconductor device according to the invention with sensors disposed on an upper side.

Represented in FIG. 8 is a semiconductor device according to the invention with a depassivation sensor applied to the upper side. On a dielectric 1, a semiconducting layer 31, for example, of silicon, has been applied (not necessarily over the full surface area) as a semiconductor region and is provided with electrical contacts as parts of a conductor layer. The contacts are covered by the semiconducting layer 31, in which vertical plated-through paths (referred to as vias) to the contacts may be provided. The contact depicted in the middle is provided here as a source contact 32, the other contacts are provided as drain contacts 33. It is also possible for a number of source contacts 32 to be provided. The regions of the semiconducting layer 31 present between the contacts are provided as channel regions, which, in a way similar to the exemplary embodiments according to FIG. 5, 6, or 7, can be activated from the underside, i.e., from that side of the semiconducting layer on which the dielectric 1 is present, by gate electrodes respectively disposed there. The gate electrodes may, however, also be omitted, so that the paths between the contacts act as ohmic resistances.

During production, the semiconducting layer 31 is deposited inhomogeneously (referred to as "dusty deposition") so that the electrical resistances in the semiconducting layer have randomly produced different values between the source contact 32 and one drain contact 33 respectively, in the directions of the arrows depicted, and a resistance network is formed. In the case of such production, the values of the resistances for the chips are different, even on the same wafer. A chip identification, which can be stored in the chip, can be ascertained by a measurement of the individual resistances. If the semiconducting layer is damaged, partially eroded or removed, the resistance values change. If the circuit integrated in the chip establishes a change in the resistance values monitored by measuring techniques, intervention for analysis of the chip construction can be assumed and an appropriately provided countermeasure can be introduced.

Figure 9:
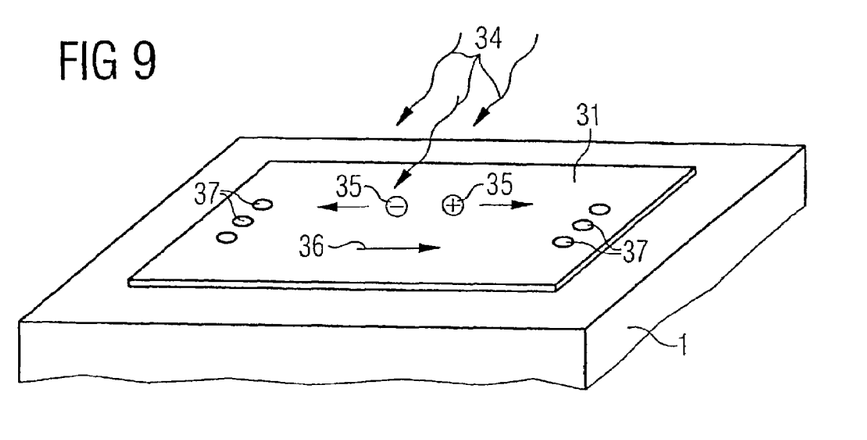
FIG. 9 is a diagrammatic, fragmentary, perspective view of yet another embodiment of the semiconductor device according to the invention with sensors disposed on an upper side.

Represented in FIG. 9 is a semiconductor device according to the invention with a light sensor applied to the upper side. On a dielectric 1, a semiconducting layer 31, for example, of silicon, has been applied (not necessarily over the full surface area) as a semiconductor region or part of the semiconductor region. A pn junction is located between doped regions, preferably formed in the semiconducting layer 31, of mutually opposed conductivity types, which are provided with electrical terminals to the wiring levels of the chip or directly to components of an integrated circuit. The electrical terminals are preferably formed by contacts 37 at the positions depicted in FIG. 9 as an example and are covered by the semiconducting layer 31, in which vertical plated-through paths (referred to as vias) to the contacts may be provided. With such an embodiment, a kind of photodiode is accordingly formed.

When there is incidence of light 34 in the semiconductor region, charge carriers 35 in the region of the pn junction, which induce a current 36 when an electric voltage is applied in the reverse direction, are separated. The photocurrent is measured, or at least detected, whereby exposure of the device to light can be concluded. If the circuit integrated in the chip registers a photocurrent of an unusual strength, intervention for analysis of the chip construction can be assumed and an appropriately provided countermeasure can be introduced.

Figure 10:
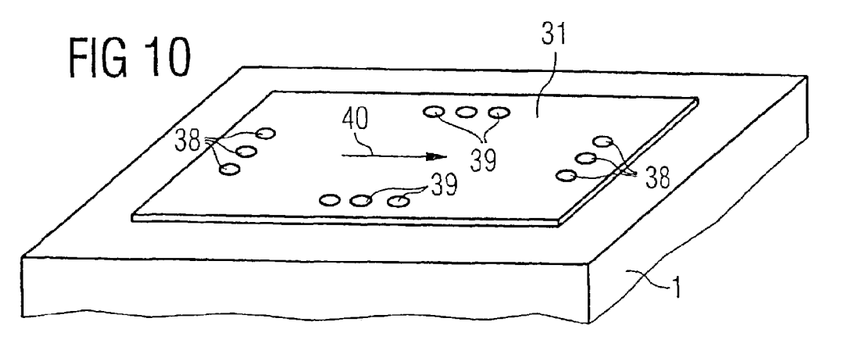
FIG. 10 is a diagrammatic, fragmentary, perspective view of still a further embodiment of the semiconductor device according to the invention with sensors disposed on an upper side.

Represented in FIG. 10 is a semiconductor device according to the invention with a Hall sensor for the detection of magnetic fields applied to the upper side. On a dielectric 1, a semiconducting layer 31, for example, of silicon, has been applied (not necessarily over the full surface area) as a semiconductor region or part of the semiconductor region and provided with electrical terminals to the wiring levels of the chip or directly to components of an integrated circuit. The electrical terminals are preferably formed by contacts 38 on semiconducting material of the same algebraic sign of conductivity at the positions depicted in FIG. 10 as an example and disposed at a distance from one another, and are covered by the semiconducting layer 31, in which vertical plated-through paths (referred to as vias) to the contacts may be provided. Between the contacts 38, further contacts 39 are disposed laterally offset.

By applying an electric voltage between the first contacts 38, a current flow can be induced in the direction of the depicted arrow 40. The moving charge carriers are deflected from their straight path in a magnetic field oriented perpendicularly with respect to the plane of the semiconducting layer 31, by the Lorentz force occurring in accordance with Lenz's law within the plane of the layer. The deflection causes concentrations of charge carriers of mutually opposed algebraic signs on both sides transversely with respect to the direction of flow. Therefore, when an external magnetic field that is aligned perpendicularly with respect to the plane of the layer occurs, a voltage can be picked off at the laterally disposed further contacts 39. Consequently, the external magnetic field can be demonstrated. If the circuit integrated in the chip registers a magnetic field of unusual strength, intervention for analysis of the chip construction can be assumed and an appropriately provided countermeasure can be introduced.

The semiconductor region, in particular, in the form of the semiconducting layer 31 according to the exemplary embodiments of FIGS. 8 to 10, can also be used in each of the exemplary embodiments described, and also the resulting modifications and further refinements that are within the scope of the invention, for detecting an external electric field that induces a difference in electric potential in the semiconducting material, which can be picked off as an electric voltage at the contacts.

We claim:

1. A semiconductor device, comprising:
   an electronic device selected from at least one of the group consisting of an active device and an integrated circuit;
   a layer structure applied to said electronic device, said layer structure having:
      a layer of a dielectric;
      at least one conductor layer having at least one structured portion;
      at least one configuration selected from the group consisting of:
         a multi-layered resistance network;
         a resistance network characteristic of an individual chip or a respective chip type;
         a resistance network formed within a polymer film by doping atoms of varying concentrations; and
         a material having a semiconductor region formed therein, said material having at least partly semiconducting properties, said material disposed at said layer of dielectric, said semiconductor region performing a function of at least one of an active part and a switching part of said electronic device; and
      said electronic device checking resistance values of said layer structure and at least one of monitoring intactness of said layer structure and establishing an identity of said layer structure based upon a check of said resistance values of said layer structure.

2. The semiconductor device according to claim 1, wherein said layer structure is a structure with a plurality of layers.

3. The semiconductor device according to claim 1, wherein said at least one configuration is of said material having said semiconductor region and said material is disposed in said dielectric layer.

4. The semiconductor device according to claim 1, wherein said at least one configuration is of said material having said semiconductor region and said material is disposed on said dielectric layer.

5. The semiconductor device according to claim 1, including a structured film disposed between a number of portions of said conductor layer as a resistance network.

6. The semiconductor device according to claim 5, wherein said resistance network is a single-layer film of at least one material selected from the group consisting of:
   hydrogen-doped amorphous silicon (a-Si:H);
   polysilicon;
   hydrogen-doped amorphous carbon (a-C:H);
   amorphous carbon (a-C:N:N);
   titanium nitride;
   tantalum nitride;
   an electrically conductive polymer; and
   an organic monomer.

7. The semiconductor device according to claim 5, wherein said resistance network a multi-layer film of at least one material selected from the group consisting of:
   hydrogen-doped amorphous silicon (a-Si:H);
   polysilicon;
   hydrogen-doped amorphous carbon (a-C:H);
   amorphous carbon (a-C:H:N);
   titanium nitride;
   tantalum nitride;
   an electrically conductive polymer; and
   an organic monomer.

8. The semiconductor device according to claim 1, wherein:
   said at least one configuration is of said material having said semiconductor region;
   said semiconductor region is a semiconducting layer;
   said at least one structured portion is a plurality of structured portions; and
   said structured portions of said conductor layer are electrically conductingly connected as contacts to said semiconducting layer.

9. In a semiconductor structure having an electronic device selected from one of the group consisting of an active device and an integrated circuit, a semiconductor device comprising:
   a layer structure applied to said electronic device, said layer structure having:
      a layer of a dielectric;
      at least one conductor layer having at least one structured portion;
      at least one configuration selected from the group consisting of:
         a multi-layered resistance network;
         a resistance network characteristic of an individual chip or a respective chip type;
         a resistance network formed within a polymer film by doping atoms of varying concentrations; and a material having a semiconductor region formed therein, said material having at least partly semiconducting properties, said material disposed at said dielectric layer, said semiconductor region performing a function of at least one of an active part and a switching part of said electronic device;

said electronic device checking resistance values of said layer structure and at least one of monitoring intactness of said layer structure and establishing an identity of said layer structure based upon a check of said resistance values of said layer structure.

10. A process for producing a semiconductor structure, which comprises:
producing a structure selected from the group consisting of an active device and an integrated circuit in a body selected from the group consisting of:
a substrate;
a semiconductor body; and
a semiconductor layered structure;
electrically isolating the structure from at least one conductor layer with a dielectric material, the conductor layer having structured portions and being provided to present ohmic resistances; and
depositing a film and structuring the film to form a resistance network presenting the ohmic resistances between two respective structured portions of the conductor layer, the ohmic resistances having prescribed conductivities.

11. The process according to claim 10, which further comprises carrying out the deposition step by depositing a single-layer film.

12. The process according to claim 10, which further comprises carrying out the deposition step by depositing a multi-layer film.

13. The process according to claim 10, which further comprises:
producing the film by one of the group consisting of:
depositing, by one of chemical vapor deposition and plasma enhanced chemical vapor deposition, one of the group consisting of:
hydrogen-doped amorphous silicon (a-Si:H);
polysilicon;
hydrogen-doped amorphous carbon (a-C:H);
amorphous carbon (a-C:H:N);
titanium nitride; and
tantalum nitride;
depositing one of the group consisting of hydrogen-doped amorphous carbon (a-C:H) and amorphous carbon (a-C:H:N) by sputtering;
depositing and doping a polymer; and
vapor depositing an organic monomer.

14. The process according to claim 13, which further comprises producing the film with at least one material selected from the group consisting of:
electropolymerized and doped polythiophene;
doped polyaniline applied by spin-coating; and
vapor-deposited pentazene.

15. The process according to claim 10, which further comprises producing the film by chemical vapor deposition of one of the group consisting of:
hydrogen-doped amorphous silicon (a-Si:H);
polysilicon;
hydrogen-doped amorphous carbon (a-C:H);
amorphous carbon (a-C:H:N);
titanium nitride; and
tantalum nitride.

16. The process according to claim 10, which further comprises producing the film by plasma enhanced chemical vapor deposition of one of the group consisting of:
hydrogen-doped amorphous silicon (a-Si:H);
polysilicon;
hydrogen-doped amorphous carbon (a-C:H);
amorphous carbon (a-C:H:N);
titanium nitride; and
tantalum nitride.

17. The process according to claim 10, which further comprises producing the film by sputtering one of the group consisting of hydrogen-doped amorphous carbon (a-C:H) and amorphous carbon (a-C:H:N).

18. The process according to claim 10, which further comprises producing the film by depositing and doping a polymer.

19. The process according to claim 10, which further comprises producing the film by vapor depositing an organic monomer.

20. A semiconductor device, comprising:
an electronic device selected from at least one of the group consisting of an active device and an integrated circuit;
a layer structure applied to said electronic device, said layer structure having:
a layer of a dielectric;
at least one conductor layer having at least one structured portion;
a resistance networks and
said electronic device checking resistance values of said layer structure and at least one of monitoring intactness of said layer structure and establishing an identity of said layer structure based upon a check of said resistance values of said layer structure.

21. The semiconductor device according to claim 20, wherein said resistance network of said layer structure is a multi-layered resistance network.

22. The semiconductor device according to claim 20, wherein said resistance network of said layer structure comprises a polymer film having varying concentrations of doping atoms therein to form said resistance network.

23. The semiconductor device according to claim 20, including a structured film disposed between a number of portions of said at least one conductor layer as a resistance network.

24. The semiconductor device according to claim 23, wherein said resistance network is a film of at least one material selected from the group consisting of hydrogen-doped amorphous silicon (a-Si:H), polysilicon, hydrogen-doped amorphous carbon (a-C:H), amorphous carbon (A-C:H:N), titanium nitride, tantalum nitride, an electrically conductive polymer, and an organic monomer.

25. A semiconductor device, comprising:
an electronic device selected from at least one of the group consisting of an active device and an integrated circuit;
a layer structure applied to said electronic device, said layer structure having:
a layer of a dielectric;
at least one conductor layer having at least one structured portion;
a material having a semiconductor region formed therein, said material having at least partly semiconducting properties, said material disposed at said dielectric layer, said semiconductor region performing a function of at least one of an active part and a switching part of said electronic device; and said electronic device checking resistance values of said layer structure and at least one of monitoring intactness of said layer structure and establishing an identity of said layer structure based upon a check of said resistance values of said layer structure.

26. The semiconductor device according to claim 25, wherein:
said semiconductor region is a semiconducting layer;
said at least one structured portion is a plurality of structured portions; and
said structured portions of said conductor layer are electrically conductingly connected as contacts to said semiconducting layer.

27. The semiconductor device according to claim 26, wherein:
said semiconducting layer with said contacts is formed as a resistance network; and
said contacts are connected to said integrated circuit to ascertain characteristic properties of said resistance network.

28. The semiconductor device according to claim 26, wherein said semiconductor region and said structured portions of said conductor layer form a field-effect transistor as a switch.

29. The semiconductor device according to claim 28, wherein:
said dielectric layer has a semiconductor region with a portion having a surface free from said dielectric;
a gate dielectric is provided at a portion of said conductor layer as a gate electrode; and
said gate dielectric is applied to said surface of said portion in at least one region.

30. The semiconductor device according to claim 29, wherein:
said semiconductor region has source and drain regions laterally disposed with respect to said gate dielectric in said semiconductor region and formed by introduction of dopant;
said source regions are provided at a portion of said conductor layer as a source terminal; and
said drain regions are provided at a portion of said conductor layer as a drain terminal.

31. The semiconductor device according to claim 28, wherein portions of said conductor layer are disposed between said dielectric layer and said semiconductor region.

32. The semiconductor device according to claim 31, wherein:
said semiconductor region is of a material;
a dielectric layer is a gate dielectric disposed between a portion of said conductor layer and said material of said semiconductor region; and
a portion of said semiconductor region adjacent to said gate dielectric is a channel region of a transistor.

33. The semiconductor device according to claim 28, wherein:
said layer structure has a passivation layer with:
a first side facing away from said semiconductor region; and
a second side facing said semiconductor region;
said semiconductor region is of an organic material and is disposed in said dielectric layer over said passivation layer;
a gate electrode is disposed as a portion of said passivation layer at said first side of said passivation layer; and
a source electrode and a drain electrode are disposed as portions of said conductor layer at said second side of said passivation layer.

34. The semiconductor device according to claim 33, wherein:
said gate electrode is disposed as a portion of said passivation layer on said first side of said passivation layer; and
said source electrode and said drain electrode are disposed as portions of said conductor layer on said second side of said passivation layer.

35. The semiconductor device according to claim 28, wherein:
said layer structure has a passivation layer with a side facing said semiconductor region;
said semiconductor region is of an organic material and is disposed in said dielectric layer at said passivation layer;
a gate electrode, a source electrode, and a drain electrode are disposed as portions of said conductor layer on said side of said passivation layer facing said, semiconductor region; and
a portion of said dielectric layer is a gate dielectric disposed between said gate electrode and said semiconductor region.

36. The semiconductor device according to claim 35, wherein said semiconductor region is disposed in said dielectric layer over said passivation layer.

37. The semiconductor device according to claim 26, wherein said semiconducting layer with said contacts is a photodiode picking off photocurrent between said contacts when said semiconductor device is irradiated.

38. The semiconductor device according to claim 26, wherein:
said contacts are disposed to induce a current flow in said semiconducting layer; and
said contacts pick off a Hall voltage occurring as a consequence of an external magnetic field.

* * * * *

UNITED STATES PATENT AND TRADEMARK OFFICE
CERTIFICATE OF CORRECTION

| | | |
|---|---|---|
| PATENT NO. | : 7,122,899 B2 | |
| APPLICATION NO. | : 10/133336 | |
| DATED | : October 17, 2006 | |
| INVENTOR(S) | : Bernhard Lippmann et al. | |

It is certified that error appears in the above-identified patent and that said Letters Patent is hereby corrected as shown below:

<u>Column 18,</u>

Line 26, "amorphous carbon (a-C:N:N)" should read -- amorphous carbon (a-C:H:N) --

Line 32, " network a multi-layer" should read -- network is a muti-layer --

Signed and Sealed this

Sixth Day of February, 2007

JON W. DUDAS
*Director of the United States Patent and Trademark Office*